(12) United States Patent
Alkhedher et al.

(10) Patent No.: US 12,244,310 B2
(45) Date of Patent: Mar. 4, 2025

(54) PROGRAMMABLE WIRING SYSTEM FOR RECONFIGURABLE DEVICES

(71) Applicant: Abu Dhabi University, Abu Dhabi (AE)

(72) Inventors: Mohammad Abdelfatah Mahmoud Alkhedher, Abu Dhabi (AE); Tariq Mansour Yousef Younes, Amman (JO); Hamza Awad Mohammad Hajeir, Amman (JO)

(73) Assignee: Abu Dhabi University, Abu Dhabi (AE)

( * ) Notice: Subject to any disclaimer, the term of this patent is extended or adjusted under 35 U.S.C. 154(b) by 29 days.

(21) Appl. No.: 18/075,493

(22) Filed: Dec. 6, 2022

(65) Prior Publication Data

US 2024/0187000 A1 Jun. 6, 2024

(51) Int. Cl.
*H03K 19/17752* (2020.01)
*H03K 19/173* (2006.01)
*H03K 19/17736* (2020.01)

(52) U.S. Cl.
CPC ... *H03K 19/17752* (2013.01); *H03K 19/1737* (2013.01); *H03K 19/17744* (2013.01)

(58) Field of Classification Search
CPC ......... H03K 19/17752; H03K 19/1737; H03K 19/17744
See application file for complete search history.

(56) References Cited

U.S. PATENT DOCUMENTS

| | | | |
|---|---|---|---|
| 5,003,200 A | | 3/1991 | Sakamoto |
| 5,436,576 A | * | 7/1995 | Hibdon ................. H03K 17/002 716/121 |
| 5,572,198 A | * | 11/1996 | Sturges .................. H04Q 3/523 326/41 |
| 10,097,185 B2 | | 10/2018 | Sullam et al. |
| 11,211,933 B2 | | 12/2021 | Liu et al. |
| 2015/0222268 A1 | * | 8/2015 | Eversmann ...... H03K 19/09407 326/41 |
| 2016/0079983 A1 | * | 3/2016 | Tatsumura ......... G11C 13/0069 326/41 |
| 2021/0224451 A1 | | 7/2021 | Liu et al. |

FOREIGN PATENT DOCUMENTS

JP 2005158815 A 6/2005

OTHER PUBLICATIONS

No Author, DAQ970A/DAQ973A Data Acquisition System—Sample More Signals, Faster and Dynamically, Keysight Technologies, Jun. 1, 2022, pp. 1-4, Keysight Technologies, USA.
Victor Murray, Field-Programmable Wiring Systems, Proceedings of the IEEE, Jul. 2015, pp. 1159-1180, vol. 103, No. 7, IEEE, New York, NY, USA.

* cited by examiner

*Primary Examiner* — Daniel D Chang

(57) ABSTRACT

A reconfigurable device-based programmable wiring system includes switches. A total number of switches is based on a total number of peripheral terminals and a total number of microcontroller pins. The total number of switches is based on a product of a total number of peripheral terminals and a total number of microcontroller pins. The reconfigurable device-based programmable wiring system includes multiple microcontroller peripherals.

9 Claims, 15 Drawing Sheets

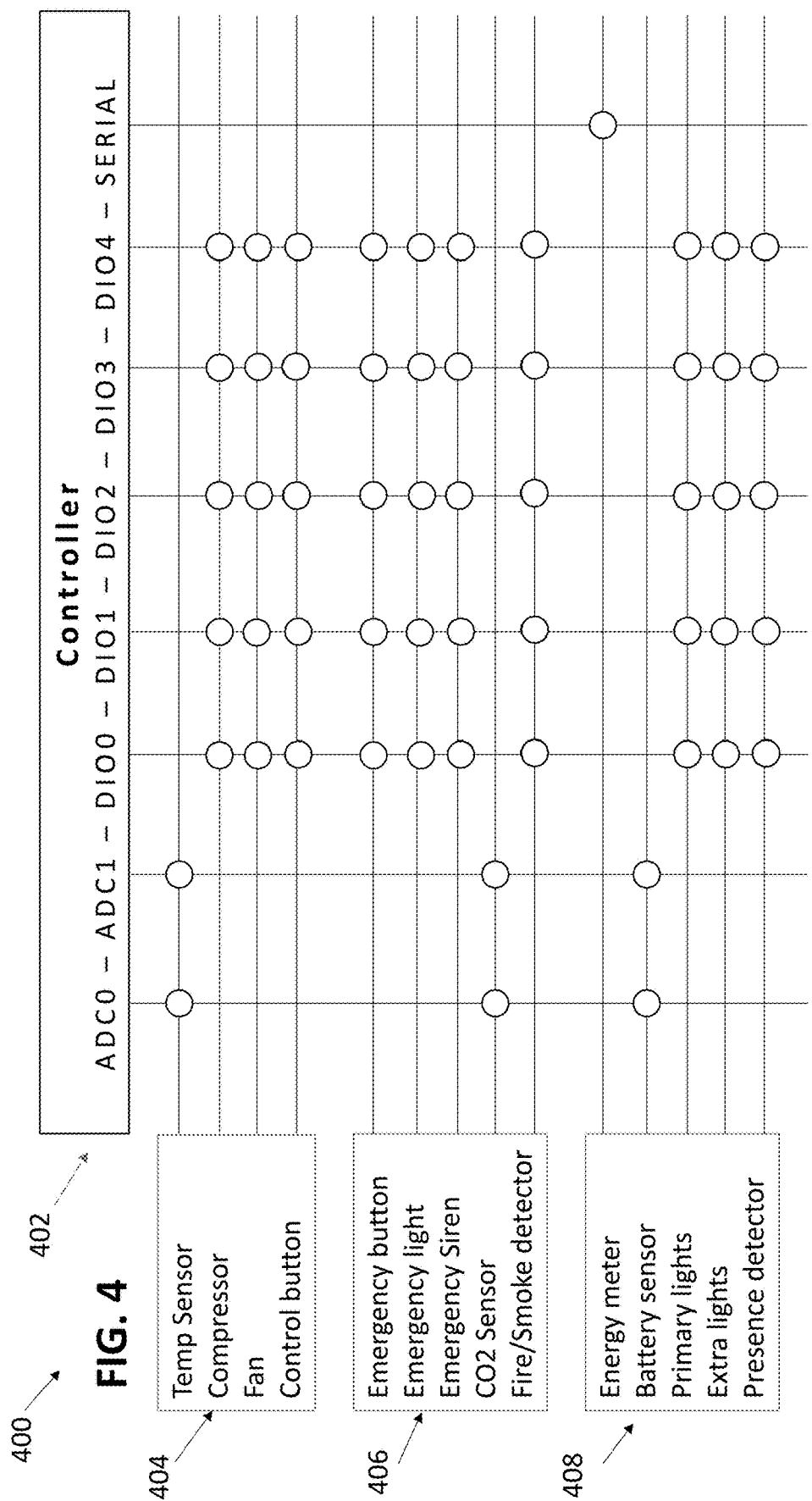

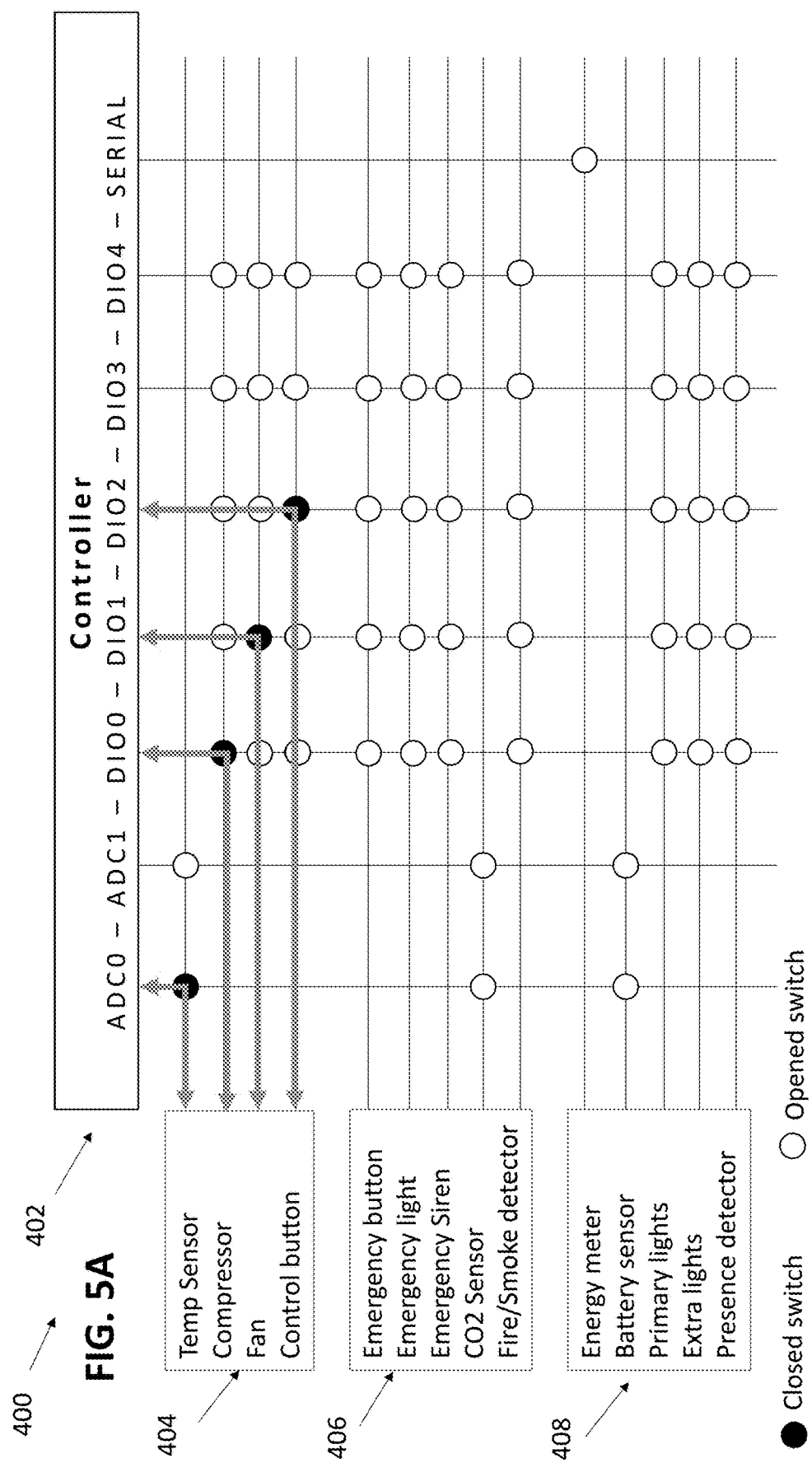

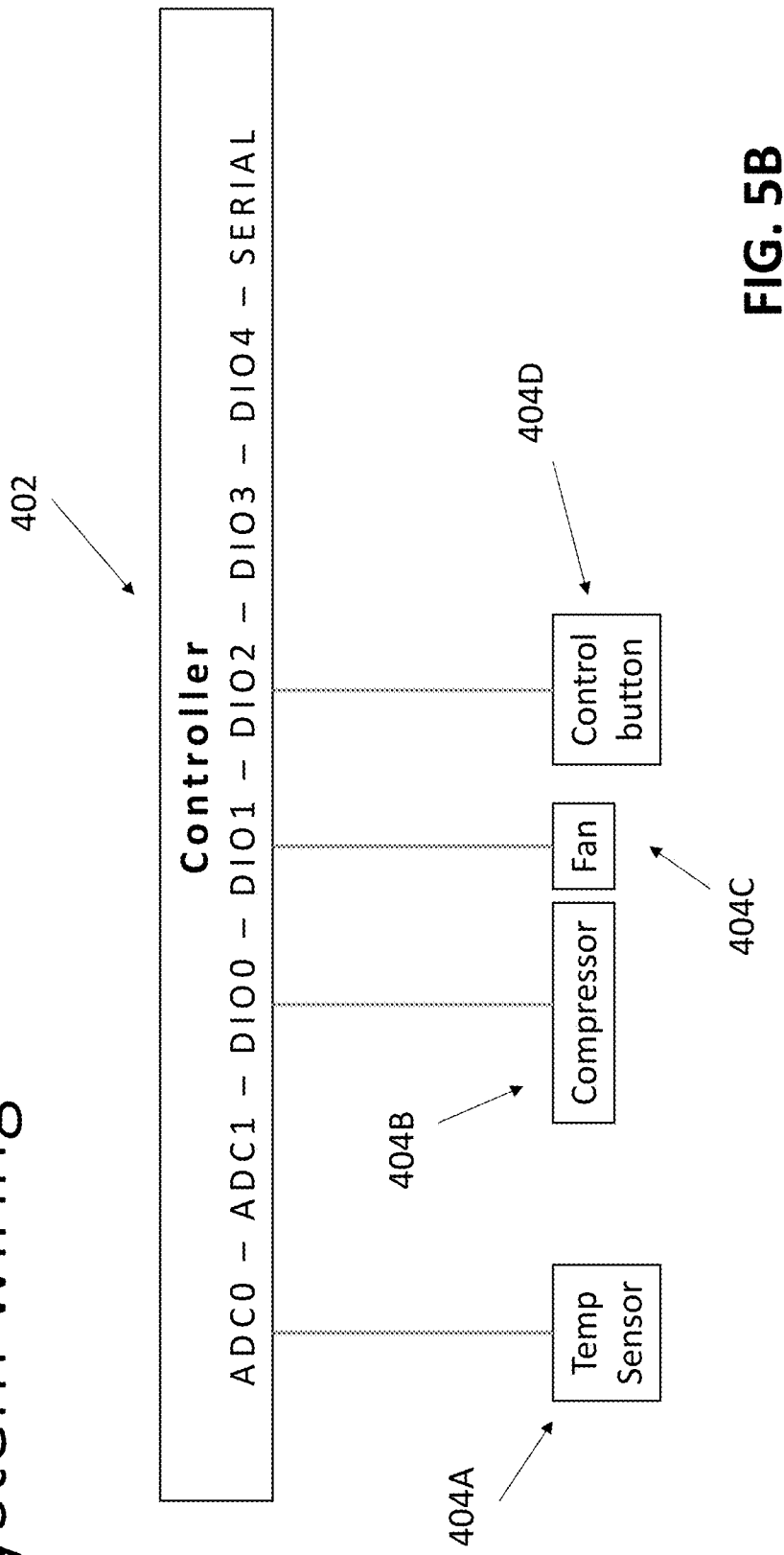

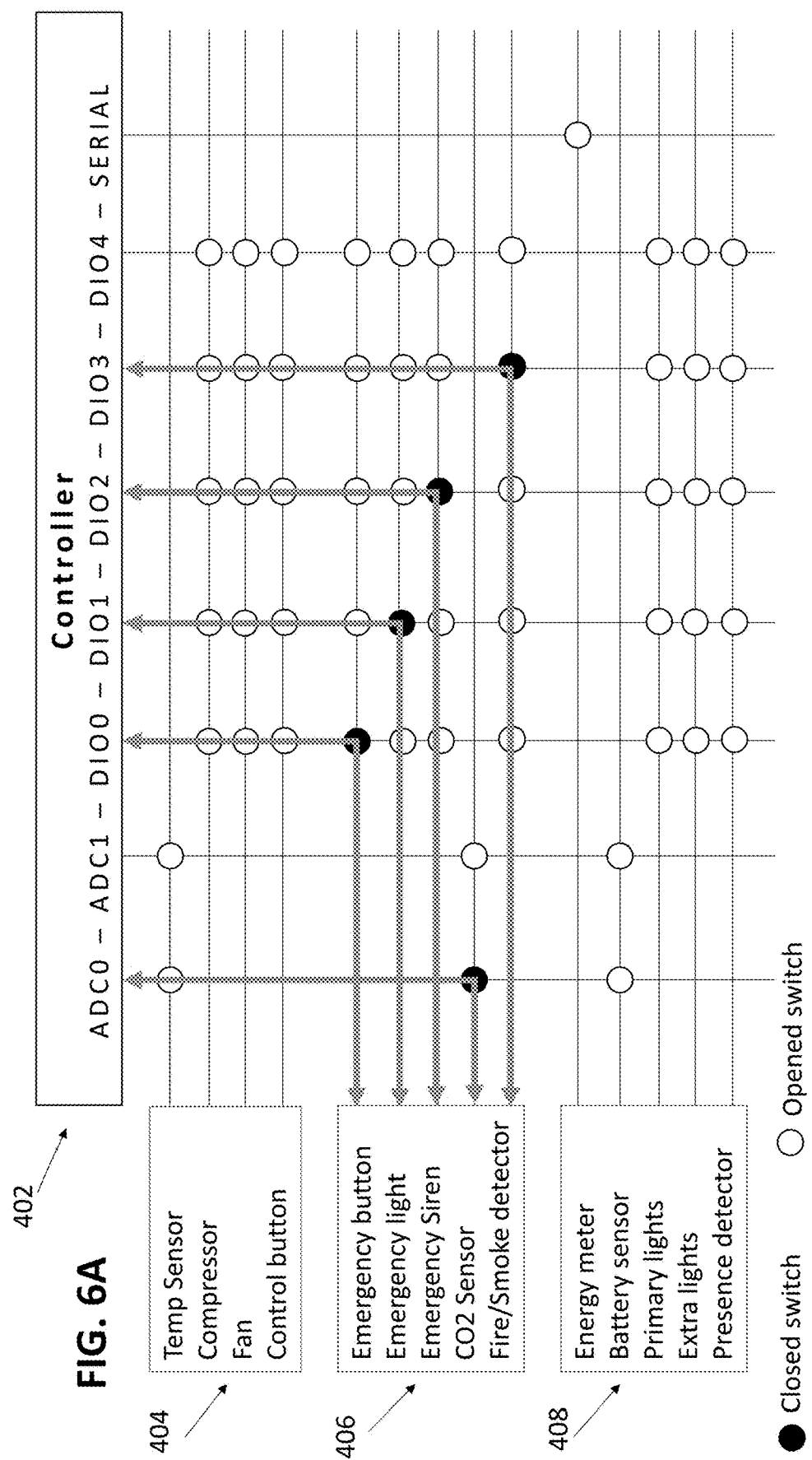

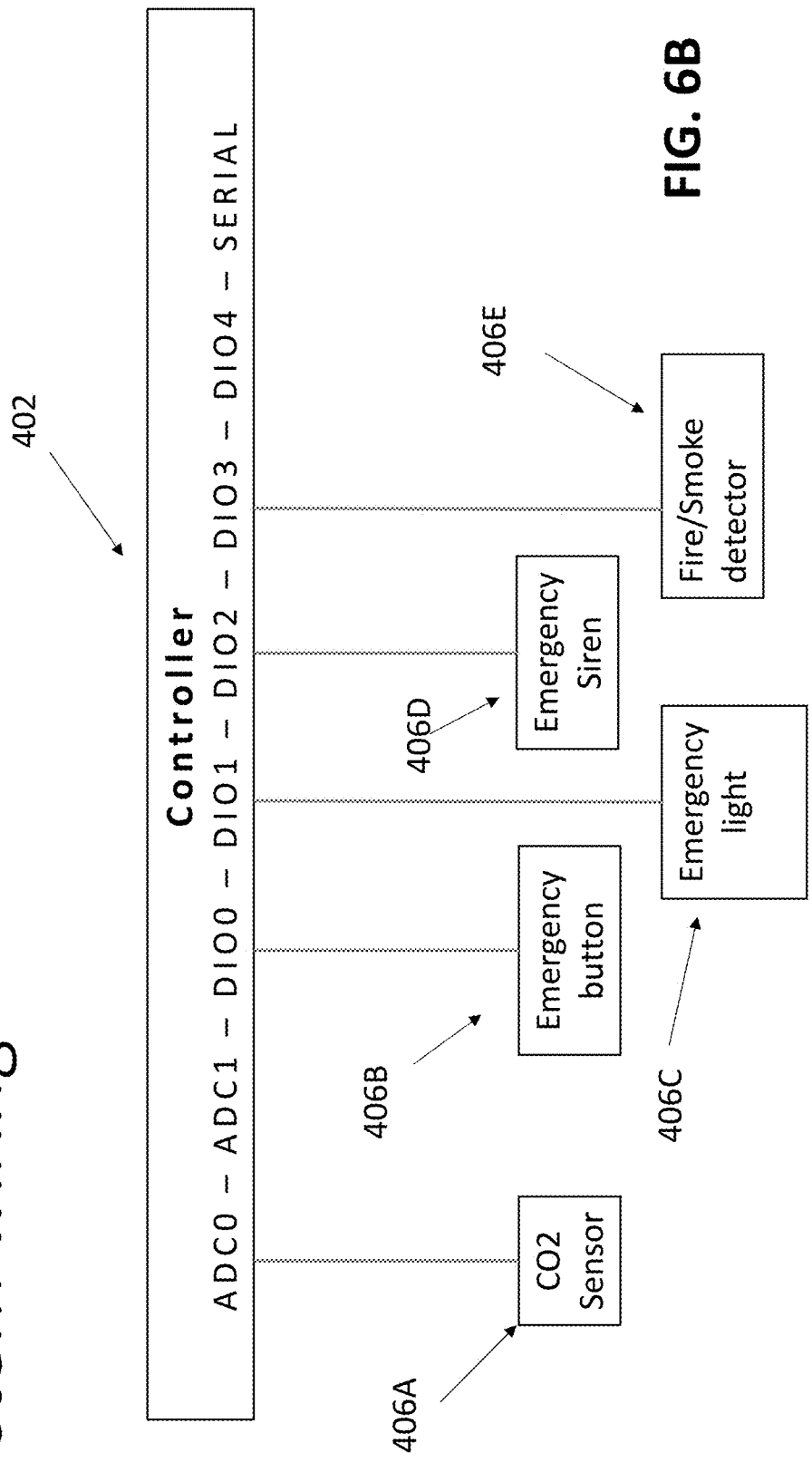

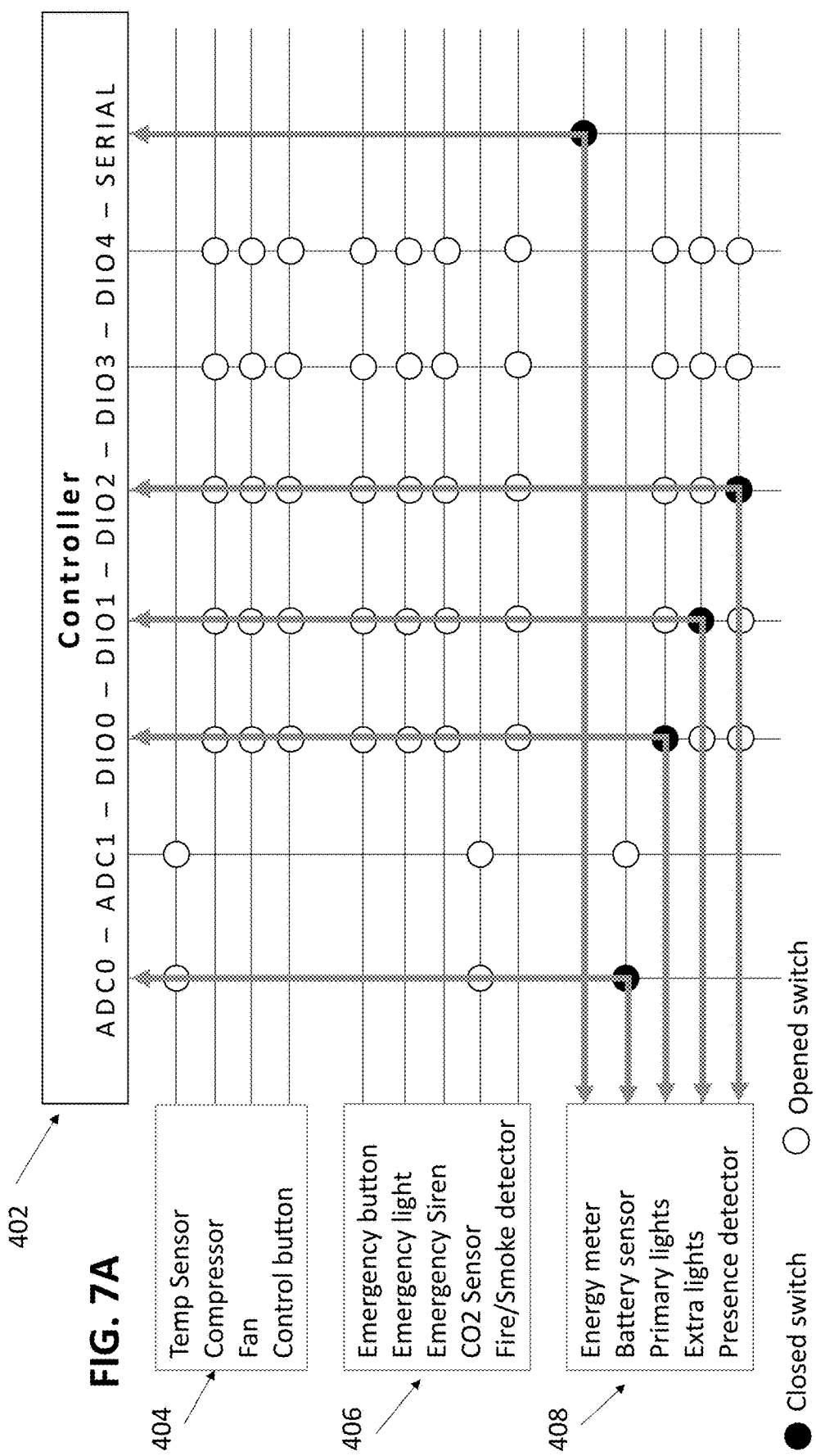

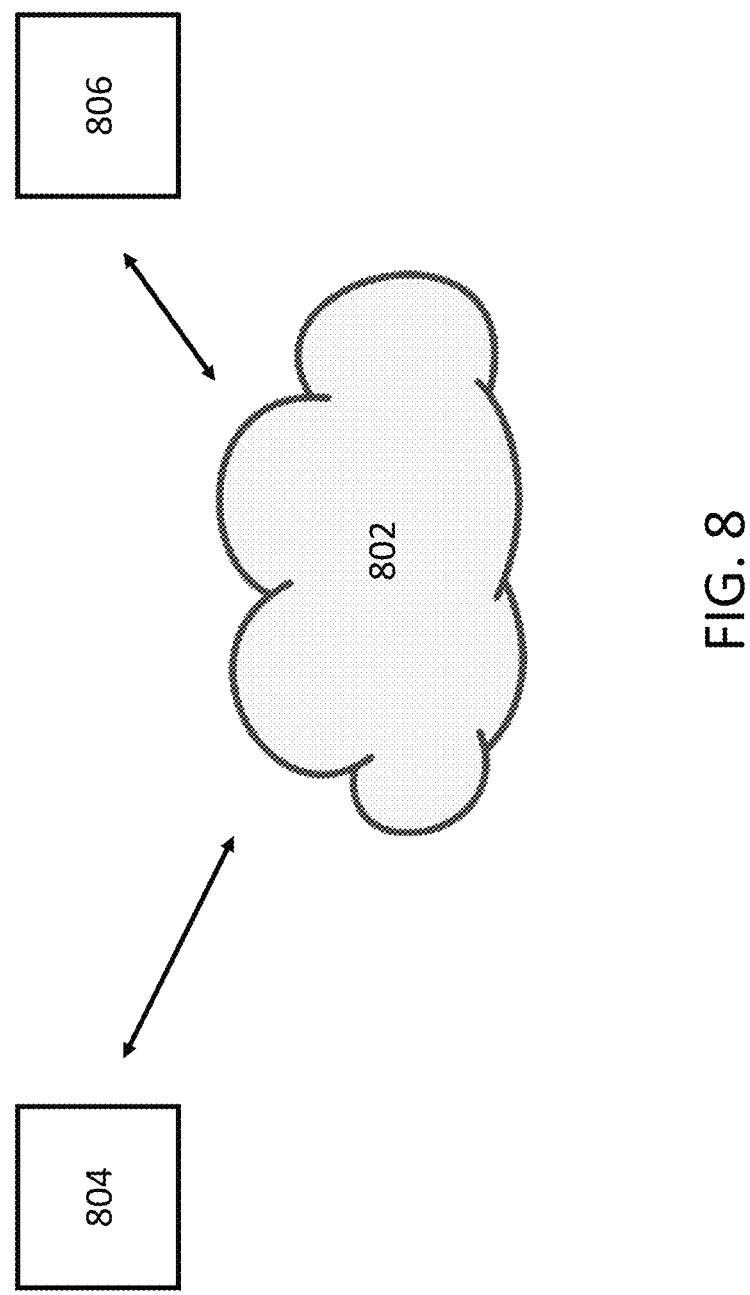

PROGRAMMABLE WIRING SYSTEM FOR RECONFIGURABLE DEVICES

BACKGROUND

In various applications, where a programmable wiring system (PWS) may be used to allow changes to a circuit without a user of the circuit being physically present at the same location of the circuit. However, to create all possible circuits within a set of terminals, a PWS requires a large number of switches. Because of the significant number of switches, the cost and size of the PWS becomes excessive. Various heuristic solutions, such as mesh of trees (MoT) and tree of meshes (ToM) have been proposed to reduce the number of switches However, no current solutions utilize a controller-based system.

BRIEF DESCRIPTION OF DRAWINGS

FIG. 4 is a diagram of an example circuit;
FIG. 5A is a diagram of an example wiring for an example circuit;
FIG. 5B is a diagram of an example wiring for an example circuit;
FIG. 6A is a diagram of an example circuit;
FIG. 6B is a diagram of an example wiring for an example circuit;
FIG. 7A is a diagram of an example circuit;
FIG. 8 is a diagram of an example networking environment.

DETAILED DESCRIPTION OF PREFERRED EMBODIMENTS

Figure 1:
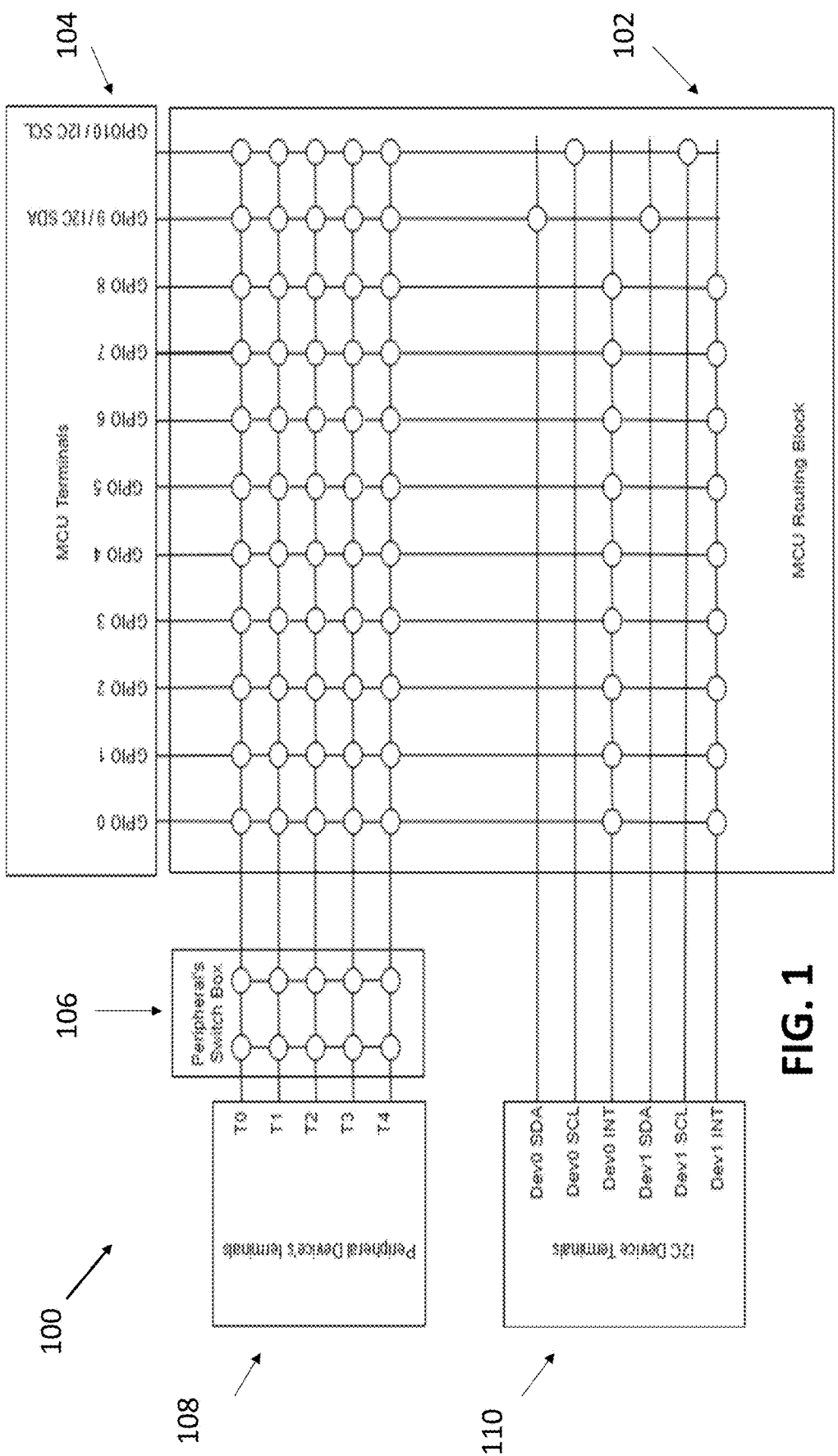
FIG. 1 is a diagram of an example circuit.

The following detailed description refers to the accompanying drawings. The same reference numbers in different drawings may identify the same or similar elements.

Systems, devices, and/or methods described herein may provide for a micro-controller based PWS (e.g., reconfigurable device-based programmable wiring system). In embodiments, the controller may include other types of controllers, such as PLCs and FPGAs. In embodiments, the microcontroller (MCU) based PWS has a customized switching panel that reduces the number of switches and also reduce costs since the number of switches are reduced. In embodiments, controller may support internal functions internally, and rarely require a connection between its external terminals. Furthermore, peripheral devices can be connected to predefined controller pins, such as analog sensors connecting to analog-to-digital converter (ADC); and, a device that communicates via an embedded protocol (e.g., I2C, SP1, etc.) may connect to controller pins that support a particular protocol.

In embodiments, the customized switching panel has a particular number of switches based on the total number of peripheral terminals ("T") and the number of microcontroller pins ("P"). In embodiments, the maximum number of switches is (T*P). For example, if a microcontroller (MCU) has 10 terminals and there are 10 peripheral terminals, the number of switches in the customized switching panel is 100. Without the customized switching panel, a PWS (i.e., a general form of PWS design) is $(P+T)^2/2$ which would indicate 200 switches.

In embodiments, a controller pin is a designation that includes Integrated Circuit's pins (IC's pins) of a microcontroller, a microprocessor, a Programmable System On Chip (PSOC), and a Programmable Logic Device (PLD), for example. In embodiments, terminals may include, in other systems, Programmable Logic Controller (PLC). In embodiments, a controller pin may be a target within a first block of switches.

In embodiments, reconfigurable devices (e.g., a reconfigurable device-based programmable wiring system) are the devices that can alter their functions, such as microcontroller unit (MCU), Computers, Field-Programmable Gate Array (FPGA), Programmable Logic Controllers (PLC), Application-Specific Integrated Circuit (ASIC), or Programmable System on Chip (PSOC). In addition, reconfigurable devices can be Digital Signal Processors (DSPs), Programmable Logic Devices (PLD), or Complex Programmable Logic Devices (CPLD).

In embodiments, some peripheral terminals do not connect to the controller directly, but through an interfacing element. In embodiments, peripheral terminals as motors terminals, may be connectable to an output circuit of an electrical switch such as a relay or a transistor, which is further being controlled by the controller via its control pin, such as the base terminal in a Bipolar Junction Transistor (BJT), for an example. Therefore, these terminals are considered unconnected to the controller block of switches.

For example, a design may consider a switch block connected to either a first controller or a second controller (e.g., ESP8266 is the first controller, and ESP32 as the second controller) in which a user of the system may perform a useful function in both controllers interchangeably, as to test a program performance execution in both MCUs with the same external circuit connected.

Accordingly, a multiplexing technique of a controller terminals or peripheral terminals is described, wherein the block of switches can be utilized to connect certain peripheral terminals to either the first controller or the second controller, wherein both controllers' terminals are connected to the block of switches by using a multiplexer, and wherein the multiplexers being a switch per terminal set in series between a controller terminal and a terminal of block of switches.

In embodiments, a programmable wiring design includes at least one block of switches, at least one peripheral device, one target per each block of switches, at least one peripheral interfacing terminal per block of switches and corresponding peripheral lines, at least one target interfacing terminal per block of switches, and corresponding target lines. In embodiments, each target includes at least one terminal. In embodiments, a peripheral device includes at least one terminal. In embodiments, the peripheral lines cross the target lines by a matrix of switches per each block of switches. In embodiments, a peripheral device terminal (also known as a peripheral terminal) is connected to a peripheral interfacing terminal of each block of switches. In embodiments, a target terminal is connected to a target interfacing terminal per each block of switches.

In embodiments, blocks of switches may allow for wiring peripheral terminals to target terminals through a matrix of switches. In embodiments, a switch is capable of wiring a peripheral line to a target line. In embodiments, the target of the first block of switches is a reconfigurable device, and with multiple blocks of switches, the first block is considered the main block. In embodiments, a programmable wiring design may reduce switches by eliminating at least one peripheral device terminal connection to blocks of switches along with the corresponding peripheral lines switches within a particular matrix.

In embodiments, when the programmable wiring design in which the target, target terminals, and target interfacing terminals of a secondary block of switches are omitted, the corresponding target lines may provide a capability of wiring between the connected peripheral devices terminals. In embodiments, the programmable wiring design includes at least one connection between a peripheral interfacing terminal and a peripheral device terminal, and at least one connection between a target interfacing terminal, wherein at least one connection is attachable (i.e., by the form of plugging, insertion, or attraction and may be detached and further removed by a form of pulling out).

In embodiments, the programmable wiring design may include at least one terminal includes a multiplexer design to allow multiplexing at least two different terminals to the terminal. In embodiments, the switches matrix of each block (of a programmable wiring design) of switches further include switches reduction by eliminating switches used to wire peripheral lines to undesired target lines.

In embodiments, at MCU-based circuits, some of the peripheral devices provide an analog electrical path, or communicate via an embedded protocol such as I2C and SPI. Thus, the signal lines of peripheral devices may be wired to specific MCU pins. Thus, the signal lines may not connect to other peripheral devices and corresponding terminals are disjointed from the peripherals switch block. In addition, a customized switching panel can reduce the number of switches by routing peripherals to selected MCU pins heuristically.

In an example circuit, one I2C peripheral device, one SPI device, two analog sensors, one button, one relay, three light emitting diodes (LEDs), two transistors, and two motors. In addition, MCU peripherals are provided that include two analog pins, seven GPIOs, and SPI and I2C ports.

Accordingly, a total of 38 terminals are provided. Based on this example circuit, the number of switches is determined to be 75 switches. In contrast there are 722 switches for a PWS general design (based on $(P+T)^2/2$.). Thus, an MCU-based PWS can be used in various types of electronic laboratories, such as digital electronic laboratories, embedded system laboratories, and transducer laboratories, remote internet of things (IoT) laboratories.

In embodiments, an MCU-based PWS can also be used in IoT laboratories. In embodiments, for a remote IoT laboratory, a circuit design may be created via computer aided design (CAD) software and then applying the circuit design (via a network, such as the Internet) to a PWS-managed device within a laboratory (such as an IoT laboratory). In embodiments, the PWS-managed device may have sensors and actuators connected to an MCU. Such PWS-managed devices may also allow application of PLC-based applications and FPGA-based applications, both remotely.

In embodiments, an MCU-based PWS can also be used in workshops for IoT, embedded, and Arduino systems. In such workshops, the MCU-based PWS has less switches and less wiring complexity.

FIG. 1 is an example electric circuit 100. FIG. 1 describes MCU routing block 102, MCU terminals 104, peripheral switch box 106, peripheral's device terminals 108, and I2C device terminals 110.

Figure 2:
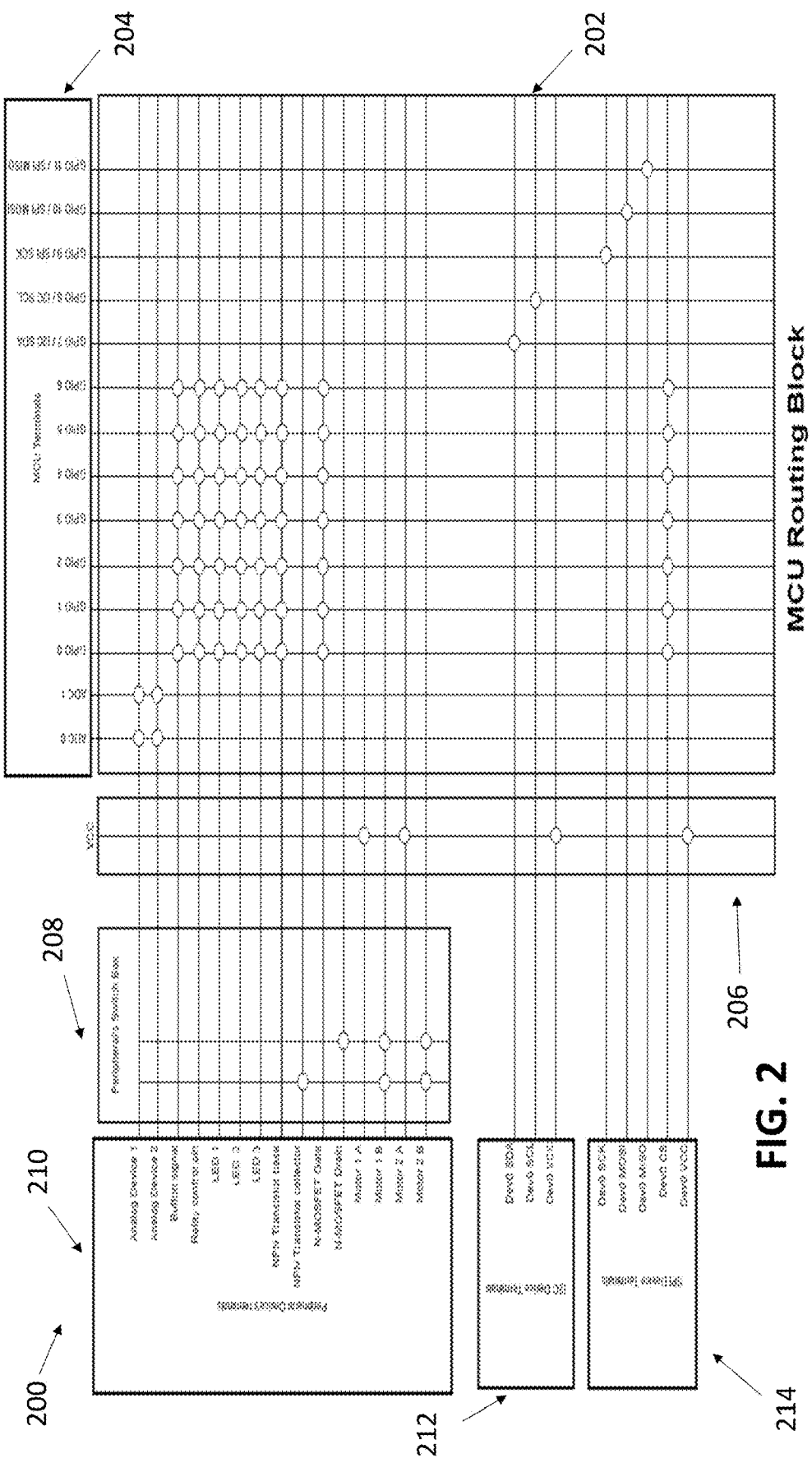
FIG. 2 is a diagram of an example circuit.

FIG. 2 is an example electric circuit 200. FIG. 2 describes MCU routing block 202, MCU terminals 204, power supply switch box 206, peripheral's switch box 208, peripheral device terminal 210, I2C device terminal 212, and SPI device terminal 214. In embodiments, digital sensors and outputs may be connected to MCU GPIOs, except embedded unintended ones. In embodiments, a customized selection wherein the connection to other GPIOs is sensible, for this design it's preferred not to, to save costs. In embodiments, transistors (NPN and MOSFET) allow the second terminal of a motor to be connected to the transistor's Collector or Drain, respectively. In embodiments, the NPN-emitter and MOSFET-source pins are hardwired to the electrical ground. In embodiments, the motor's first terminal is connectable to the VCC.

Figure 3:
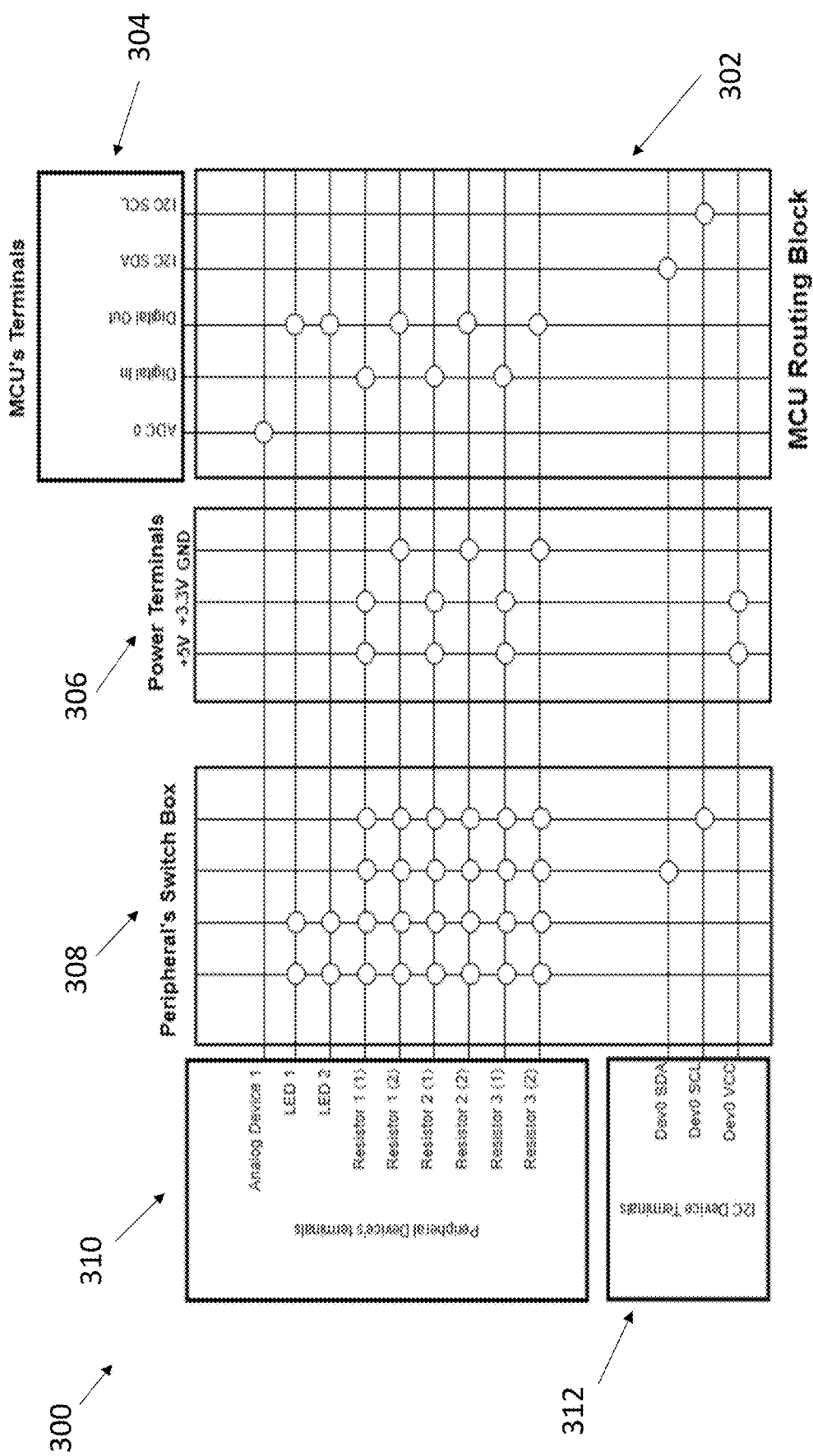
FIG. 3 is a diagram of an example circuit.

FIG. 3 is an example electric circuit 300. FIG. 3 describes MCU routing block 302, MCU terminals 304, power terminals switching box 306, peripheral's switch box 308, peripheral devices' terminals 310, and I2C device terminals 312. In embodiments, peripheral's switch box 308 can be used to form a diverse number of circuits by based on the switches at peripheral's switch box. In embodiments, capable circuits can be parallel resistors, series resistors, current limiting resistor connected to an LED.

FIG. 4 is an example electric circuit 400. FIG. 4 describes controller 402, terminal system 404, terminal system 406, and terminal system 408. As shown in FIG. 4, controller 402 includes terminals ADC0, ADC1, DIO0, DIO1, DIO2, DIO3, DIO4, and Serial. As shown in FIG. 4, there are switches that are between different controller terminals and the terminal system's devices. As shown in FIG. 4, all the switches are open. In FIG. 5A, electric circuit 400 is shown with the switch between temp sensor and ADC0, the switch between compressor and DIO0, the switch between fan and DIO1, and the switch between control button and DIO2 are all closed. As shown in FIG. 5A, the other switches are open. Based on the closed switches, an example wiring system is shown in FIG. 5B.

FIG. 6A shows electric circuit 400 with the switch between emergency button and DIO0, the switch between emergency light and DIO1, the switch between emergency siren and DIO2, and the switch between fire/smoke detector and DIO3 are all closed. As shown in FIG. 6A, the other switches are open. Based on the closed switches shown in FIG. 6A, an example wiring system is shown in FIG. 6B.

Figure 7B:
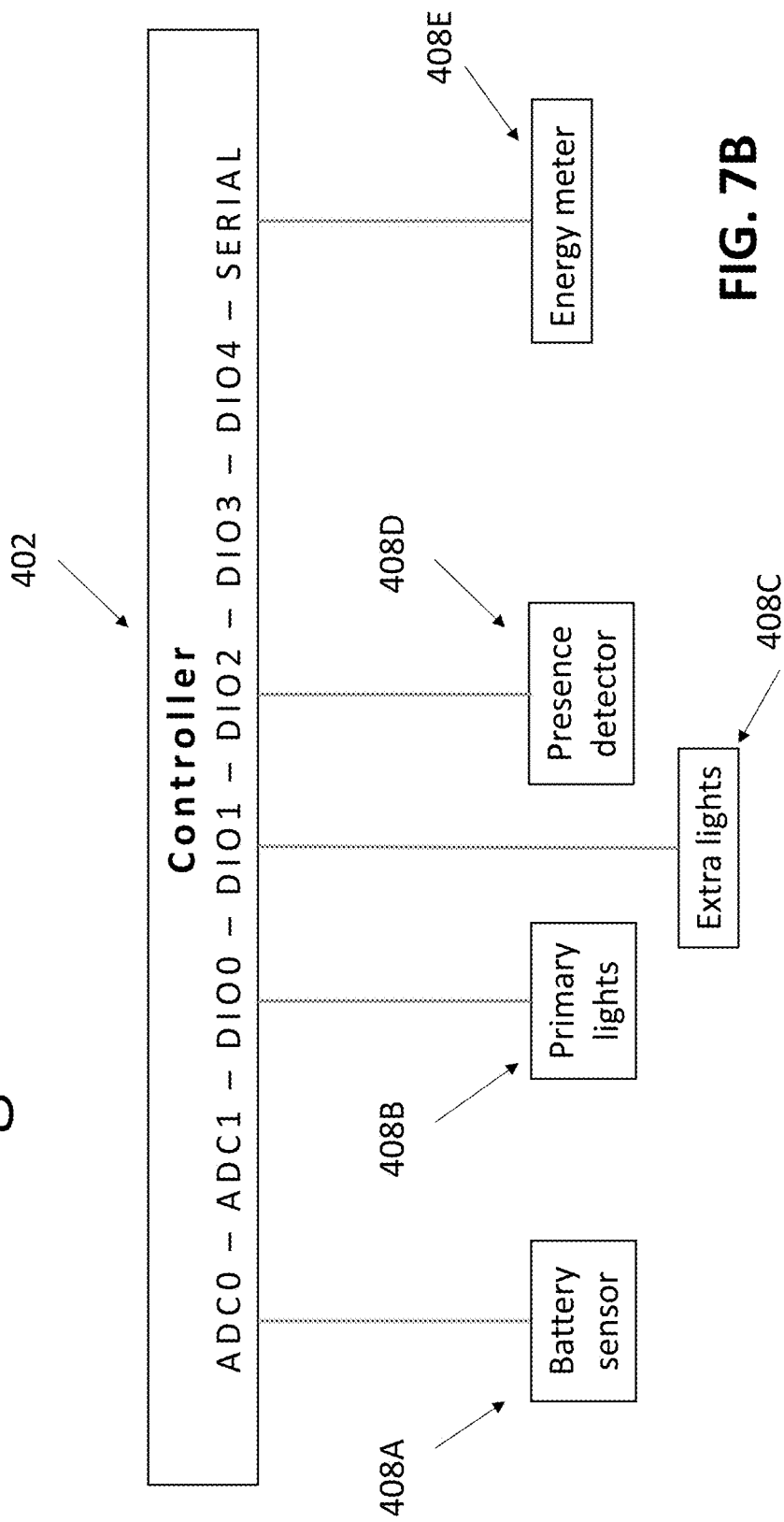
FIG. 7B is a diagram of an example wiring for an example circuit.

FIG. 7A shows electric circuit 400 with the switch between energy meter and Serial, the switch between battery sensor and ADC0, the switch between extra lights and DIO1, the switch between primary lights and DIO0, and the switch between presence detector and DIO2 are all closed. As shown in FIG. 7A, the other switches are open. Based on the closed switches shown in FIG. 7A, an example wiring system is shown in FIG. 7B.

FIG. 8 is a diagram of example environment 800 in which systems, devices, and/or methods described herein may be implemented. FIG. 8 shows network 802, computing device 804, and user device 806.

Network 802 may include a local area network (LAN), wide area network (WAN), a metropolitan network (MAN), a telephone network (e.g., the Public Switched Telephone Network (PSTN)), a Wireless Local Area Networking (WLAN), a WiFi, a hotspot, a Light fidelity (LiFi), a Worldwide Interoperability for Microware Access (WiMax), an ad hoc network, an intranet, the Internet, a satellite network, a GPS network, a fiber optic-based network, and/or combination of these or other types of networks. Additionally, or alternatively, network 802 may include a cellular network, a public land mobile network (PLMN), a second generation (2G) network, a third generation (3G) network, a fourth generation (4G) network, a fifth generation (5G) network, and/or another network. In embodiments, network 802 may allow for devices describe any of the described figures to electronically communicate (e.g., using emails, electronic signals, URL links, web links, electronic bits, fiber optic signals, wireless signals, wired signals, etc.) with each other so as to send and receive various types of electronic communications.

Computing device 804 may include any computation or communications device that is capable of communicating with a network (e.g., network 802). For example, computing device 804 may be a computing device similar to device 900 as described in FIG. 9. In embodiments, computing device 804 may be used to control a PWS machine (e.g., a microcontroller-based programming wiring system). In embodiments, a PWS machine may include one or more computing devices 804.

User device 806 may include a radiotelephone, a personal communications system (PCS) terminal (e.g., that may combine a cellular radiotelephone with data processing and data communications capabilities), a personal digital assistant (PDA) (e.g., that can include a radiotelephone, a pager, Internet/intranet access, etc.), a smart phone, a desktop computer, a laptop computer, a tablet computer, a camera, a personal gaming system, a television, a set top box, a digital video recorder (DVR), a digital audio recorder (DUR), a digital watch, a digital glass, or another type of computation or communications device. In embodiments, user device 806 may, via network 802, send electronic communications to computing device 804.

Figure 9:
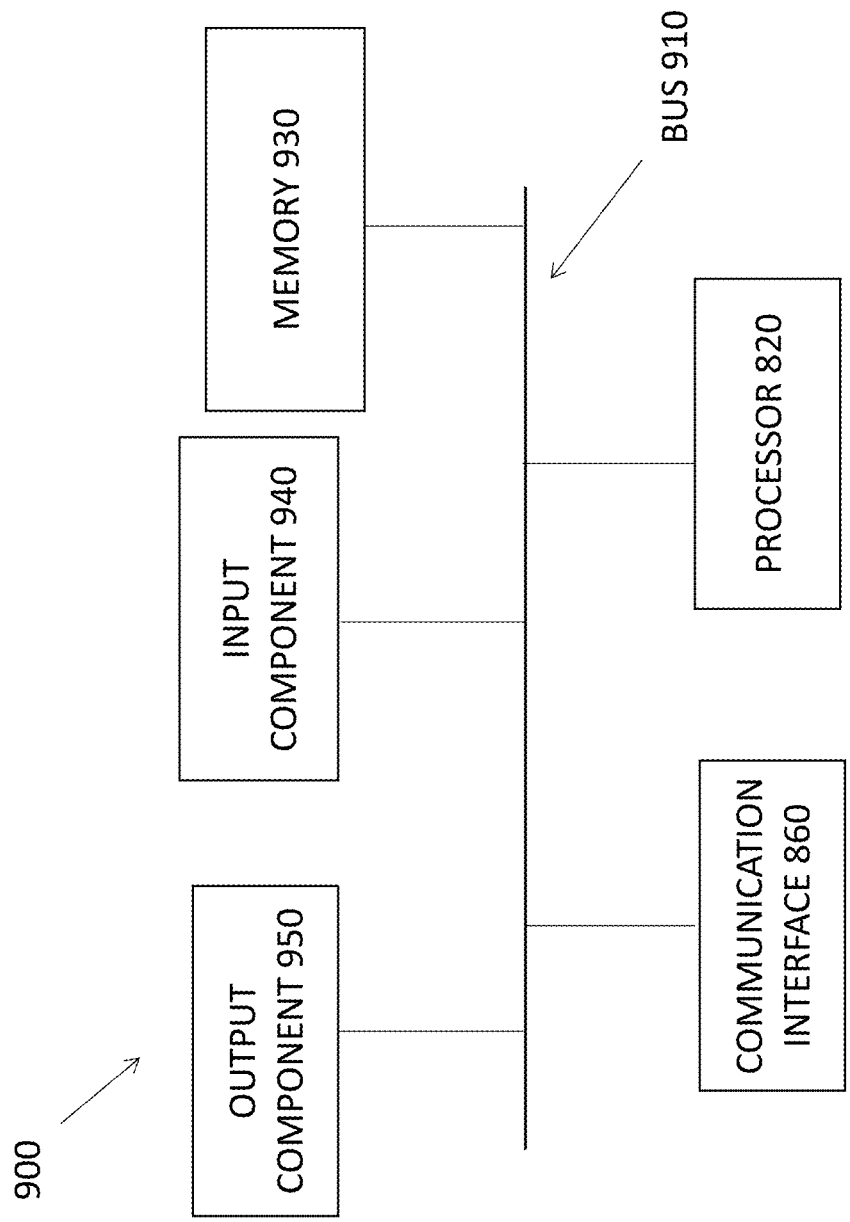
FIG. 9 is a diagram of an example computing device.

FIG. 9 is a diagram of example components of a device 900. Device 900 may correspond to computing device 804. Device 900 may include one or more devices 900 and/or one or more components of device 900.

As shown in FIG. 9, device 900 may include a bus 910, a processor 920, a memory 930, an input component 940, an output component 950, and a communications interface 960. In other implementations, device 900 may contain fewer components, additional components, different components, or differently arranged components than depicted in FIG. 9. Additionally, or alternatively, one or more components of device 900 may perform one or more tasks described as being performed by one or more other components of device 900.

Bus 910 may include a path that permits communications among the components of device 900. Processor 920 may include one or more processors, microprocessors, or processing logic (e.g., a field programmable gate array (FPGA) or an application specific integrated circuit (ASIC)) that interprets and executes instructions. Memory 930 may include any type of dynamic storage device that stores information and instructions, for execution by processor 920, and/or any type of non-volatile storage device that stores information for use by processor 920. Input component 940 may include a mechanism that permits a user to input information to device 900, such as a keyboard, a keypad, a button, a switch, voice command, etc. Output component 950 may include a mechanism that outputs information to the user, such as a display, a speaker, one or more light emitting diodes (LEDs), etc.

Communications interface 960 may include any transceiver-like mechanism that enables device 900 to communicate with other devices and/or systems. For example, communications interface 960 may include an Ethernet interface, an optical interface, a coaxial interface, a wireless interface, or the like. In another implementation, communications interface 960 may include, for example, a transmitter that may convert baseband signals from processor 920 to radio frequency (RF) signals and/or a receiver that may convert RF signals to baseband signals. Alternatively, communications interface 960 may include a transceiver to perform functions of both a transmitter and a receiver of wireless communications (e.g., radio frequency, infrared, visual optics, etc.), wired communications (e.g., conductive wire, twisted pair cable, coaxial cable, transmission line, fiber optic cable, waveguide, etc.), or a combination of wireless and wired communications.

Communications interface 960 may connect to an antenna assembly (not shown in FIG. 9) for transmission and/or reception of the RF signals. The antenna assembly may include one or more antennas to transmit and/or receive RF signals over the air. The antenna assembly may, for example, receive RF signals from communications interface 960 and transmit the RF signals over the air, and receive RF signals over the air and provide the RF signals to communications interface 960. In one implementation, for example, communications interface 960 may communicate with network 802.

As will be described in detail below, device 900 may perform certain operations. Device 900 may perform these operations in response to processor 920 executing software instructions (e.g., computer program(s)) contained in a computer-readable medium, such as memory 930, a secondary storage device (e.g., hard disk, CD-ROM, etc.), or other forms of RAM or ROM. A computer-readable medium may be defined as a non-transitory memory device. A memory device may include space within a single physical memory device or spread across multiple physical memory devices. The software instructions may be read into memory 930 from another computer-readable medium or from another device. The software instructions contained in memory 930 may cause processor 920 to perform processes described herein. Alternatively, hardwired circuitry may be used in place of or in combination with software instructions to implement processes described herein. Thus, implementations described herein are not limited to any specific combination of hardware circuitry and software.

Figure 10:
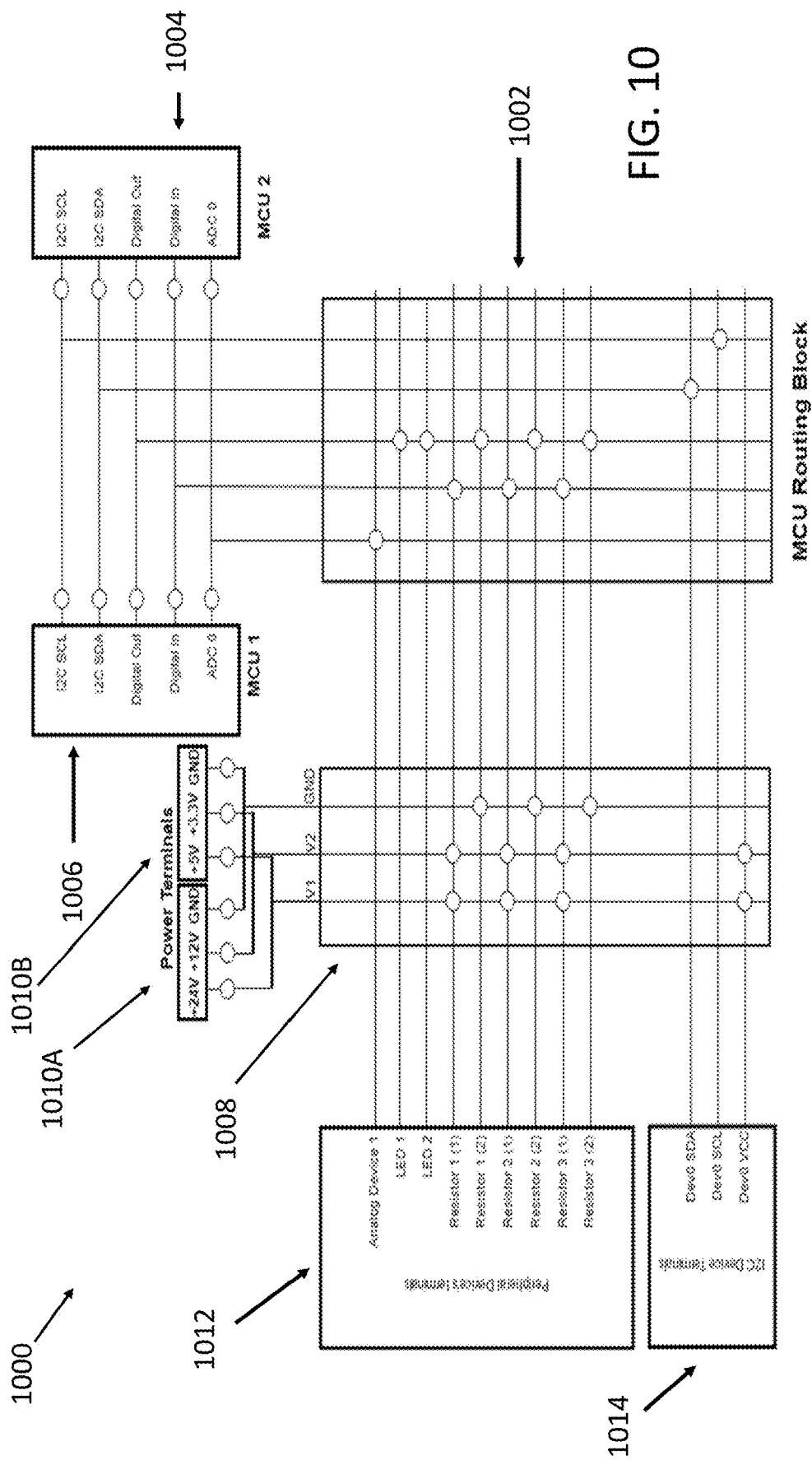
FIG. 10 is a diagram of an example circuit.

FIG. 10 is an example electric circuit 1000. FIG. 10 describes MCU routing block 1002, MCU terminals 1004 and 1006, power supply switch box 1008, power terminals 1010A and 1010B, peripheral devices' terminals 1012, and I2C device terminals 1014. In embodiments, electric circuit 1000 has power of either +24V or +5V is connected to V1 line, and either +12V or +3.3V is connected to V2 line of the block of switches. In embodiments, the first power source's ground or the second power source's ground is connected to GND line. In embodiments, multiple peripheral devices terminals can share the same peripheral terminals by the means of a multiplexer, wherein the user is capable to select one of peripheral devices by controlling the state of multiplexer's switches, by its complex form, also known as multiplexers in electronics domain, or by the simplest form as mentioned earlier.

Figure 11:
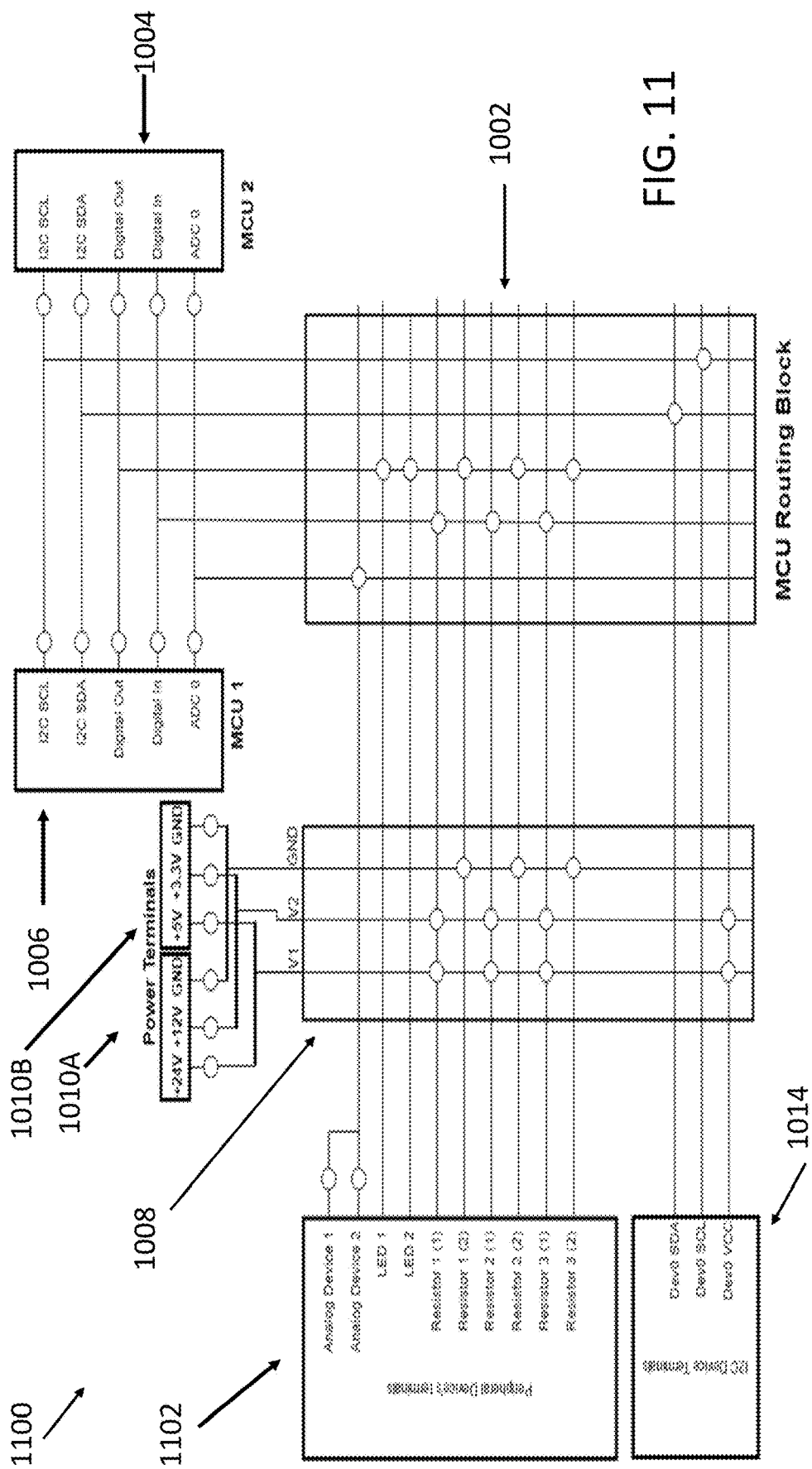
FIG. 11 is a diagram of an example circuit.

FIG. 11 is an example electric circuit 1100. FIG. 11 describes MCU routing block 1002, MCU terminals 1004 and 1006, power supply switch box 1008, power terminals 1010A and 1010B, peripheral devices' terminals 1102, and I2C device terminals 1014. As shown in FIG. 11, two analog devices share the same line that is to connect to an analog pin. Accordingly, the design shown in FIG. 11 reduces the number of switches, wherein at least one terminal of two or more peripheral terminals are meant to connect to the controller at the same time. In alternate embodiments, connecting at least two terminals to the same peripheral terminal would form a first joint of a parallel connection.

Figure 12:
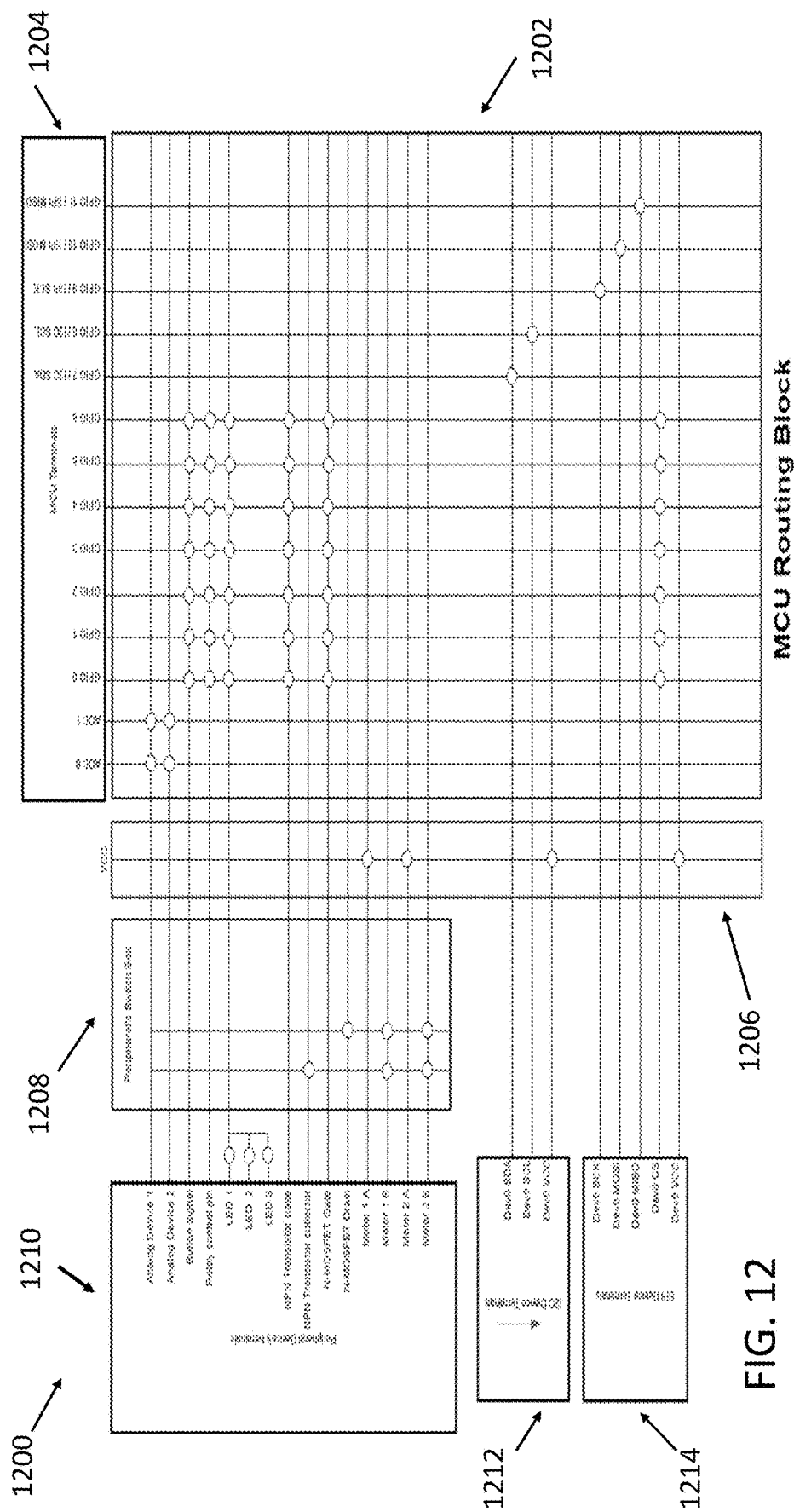
FIG. 12 is a diagram of an example circuit.

FIG. 12 is an example electric circuit 1200. FIG. 12 describes MCU routing block 1202, MCU terminals 1204, power supply switch box 1206, peripheral's switch box 1208, peripheral device terminal 1210, I2C device terminal 1212, and SPI device terminal 1214. In embodiments, circuit 1200 may be used to multiplex LED while saving the number of switches in a manner similar to described in other figures.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

While various actions are described as selecting, displaying, transferring, sending, receiving, generating, notifying, and storing, it will be understood that these example actions are occurring within an electronic computing and/or electronic networking environment and may require one or more computing devices, as described in FIG. 9, to complete such actions.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A reconfigurable device-based programmable wiring system, comprising:
   switches,
      wherein a total number of switches is based on a total number of peripheral terminals and a total number of microcontroller pins, wherein at least one of the total number of microcontroller pins is an analog sensor, and
      wherein the at least one of the total number of microcontroller pins is connected to an analog-to-digital converter,
      wherein the total number of switches is (total number of peripheral terminals)*(total number of microcontroller pins), wherein at least one of the total number of peripheral terminals includes a Programmable Logic Controller PLC), and
   wherein the reconfigurable device-based programmable wiring system is a micro-controller based programmable wiring system that is configured to be a microcontroller unit (MCU), a computer, a Field-Programmable Gate Array (FPGA), a Programmable Logic Controllers (PLC), an Application-Specific Integrated Circuit (ASIC), or a Programmable System on Chip (PSOC),
   and wherein the reconfigurable device-based programmable wiring system includes:
      at first peripheral device,
         wherein:
            the first peripheral device includes an I2C embedded protocol,
            the first peripheral device is configured to attach to at least one of the total number of peripheral terminals,
            a first signal line of the first peripheral device is wired to at least one of the total number of microcontroller pins and the first signal line does not connect to any other peripheral devices, and
      a second peripheral device,
         wherein:
            the second peripheral device includes an SPI embedded protocol, and
            a second signal line of the second peripheral device is wired to at least another of the total number of microcontroller pins, and the second signal line does connect to a third peripheral device.

2. The reconfigurable device-based programmable wiring system of claim 1, wherein the switches are part of one matrix of switches per each block of switches.

3. The reconfigurable device-based programmable wiring system of claim 2, wherein the at least one peripheral device includes a peripheral device terminal, and wherein the peripheral device terminal is connected to a peripheral interfacing terminal of each of the block of switches.

4. The reconfigurable device-based programmable wiring system of claim 3, further comprising at least one target interfacing terminal, target lines, and peripheral lines, wherein:
   the at least one target interfacing terminal is connected to at least one target terminal for each block of switches;
   the peripheral device terminal includes at least one other device terminal for each of the block of switches; and
   the peripheral lines and the target lines form a matrix of switches for each of the block of switches.

5. The reconfigurable device-based programmable wiring system of claim 4, in which the reconfigurable device-based programmable wiring system, being a microcontroller system reduces the total number of switches by eliminating at least one peripheral device terminal connection to undesired blocks of switches along with the switches within the corresponding peripheral lines within the matrix of switches.

6. The reconfigurable device-based programmable wiring system of claim 4, wherein another target, other target terminals, and other target interfacing terminals of a secondary block of switches are omitted, and wherein additional target lines provide wiring between the peripheral device terminal.

7. The reconfigurable device-based programmable wiring system of claim 4, wherein at least one connection between the peripheral interfacing terminal and the peripheral device terminal is attachable.

8. The reconfigurable device-based programmable wiring system of claim 4, wherein at least one connection between the target interfacing terminal and the at least one target terminal is attachable.

9. The reconfigurable device-based programmable wiring system of claim 4, wherein the peripheral device terminal comprises a multiplexer design to multiplex at least two other terminals to the peripheral device terminal.

\* \* \* \* \*